(12) United States Patent
Toms (10) Patent No.: US 7,904,770 B2
(45) Date of Patent: Mar. 8, 2011

(54) TESTING CIRCUIT SPLIT BETWEEN TIERS OF THROUGH SILICON STACKING CHIPS

(75) Inventor: Thomas R. Toms, Dripping Springs, TX (US)

(73) Assignee: QUALCOMM Incorporated, San Diego, CA (US)

( * ) Notice: Subject to any disclaimer, the term of this patent is extended or adjusted under 35 U.S.C. 154(b) by 239 days.

(21) Appl. No.: 12/206,977

(22) Filed: Sep. 9, 2008

(65) Prior Publication Data

US 2010/0060312 A1 Mar. 11, 2010

(51) Int. Cl.
*G01R 31/28* (2006.01)
*G01R 31/02* (2006.01)
*H01L 23/58* (2006.01)
*H01L 23/12* (2006.01)
*H01L 23/34* (2006.01)
*H01L 23/48* (2006.01)

(52) U.S. Cl. .......... 714/724; 324/537; 257/48; 257/700; 257/713; 257/777

(58) Field of Classification Search .................. 714/724; 324/537; 257/48, 700, 713, 777
See application file for complete search history.

(56) References Cited

U.S. PATENT DOCUMENTS

| | | | |
|---|---|---|---|
| 5,673,276 A | | 9/1997 | Jarwala |
| 5,857,858 A | * | 1/1999 | Gorowitz et al. ............... 439/86 |
| 7,372,130 B2 | * | 5/2008 | Kikuchi et al. ............... 257/668 |
| 7,402,897 B2 | * | 7/2008 | Leedy ........................... 257/678 |
| 7,467,341 B2 | * | 12/2008 | Sato ............................... 714/727 |
| 2003/0079166 A1 | | 4/2003 | Vermeulen et al. |
| 2005/0041482 A1 | | 2/2005 | Tomishima |
| 2006/0220230 A1 | * | 10/2006 | Tanaka et al. .................. 257/723 |
| 2006/0220672 A1 | | 10/2006 | Sato |
| 2007/0035033 A1 | * | 2/2007 | Ozguz et al. ................... 257/777 |
| 2008/0284611 A1 | * | 11/2008 | Leedy ........................ 340/815.4 |
| 2009/0194768 A1 | * | 8/2009 | Leedy ............................ 257/48 |
| 2009/0319968 A1 | * | 12/2009 | Wang et al. ...................... 716/5 |
| 2009/0321947 A1 | * | 12/2009 | Pratt .............................. 257/777 |

OTHER PUBLICATIONS

International Search Report-PCT/US2009/056059, International Search Authority-European Patent Office Feb. 9, 2010.
Written Opinion-PCT/US2009/056059, International Search Authority-European Patent Office Feb. 9, 2010

* cited by examiner

*Primary Examiner* — John J Tabone, Jr.
(74) *Attorney, Agent, or Firm* — Sam Talpalatsky; Nicholas J. Pauley; Jonathan T. Velasco (57) ABSTRACT

A method of testing a die having a non-testable circuit, where the non-testable circuit is logically incomplete and forms part of a logically complete multiple tier circuit. The method includes reconfiguring a tier-to-tier input point or tier-to-tier output point associated with a primary path of the non-testable circuit to create a logically complete secondary path for the tier-to-tier point such that the non-testable circuit can be tested. Testable dies and methods of preparing such dies are also provided.

24 Claims, 5 Drawing Sheets

TESTING CIRCUIT SPLIT BETWEEN TIERS OF THROUGH SILICON STACKING CHIPS

BACKGROUND

1. Field of Disclosure

This disclosure relates generally to 3D silicon stacking, and in particular to circuits constructed on multiple dies stacked into tiers.

2. Background

One feature of through silicon or 3D stacking technology is the construction of a complete circuit on multiple dies stacked into tiers. Each part of the circuit is prepared on a separate die using conventional Si processing, then the dies are stacked together and joined to create a complete circuit. By bringing various parts of a circuit closer together and reducing chip footprint size, through silicon stacking can increase chip speed and decrease the size of a semiconductor package.

The way that 3D stacking technology can be incorporated into circuits ranges from the placement of different circuit functions in separate tiers, to the formation of a single logic gate split across multiple tiers. At an intermediate level, a single functional unit can be divided over multiple tiers. For example, an arithmetic logic unit (ALU) can have its computation and register portions on separate tiers, providing shorter path lengths and increased speed between the computational and register functions.

Unless a die fabrication process yields a very high percentage of good dies, some form of screening or testing of individual dies prior to their incorporation into a multiple tier stack is advantageous. Otherwise, the loss of stacks due to the incorporation of a defective die can become significant. By its very nature, however, 3D stacking technology involves dies having tier-to-tier connections that are difficult to test by conventional methods before the dies are incorporated into a stack. The difficulty is that the circuits associated with the tier-to-tier connections are logically incomplete until the dies are connected. Thus, a method of testing a die having such logically incomplete circuits is desirable.

SUMMARY

In one aspect, a method of testing a die is provided, where the die contains a non-testable circuit that forms part of a logically complete multiple tier circuit. The method includes reconfiguring a tier-to-tier input point or tier-to-tier output point associated with a primary path of the non-testable circuit. The tier-to-tier input or output point is reconfigured by creating a logically complete secondary path for the tier-to-tier input or output point such that the non-testable circuit can be tested.

In another aspect, a method of making a testable die is provided. The method includes: identifying a tier-to-tier input point or a tier-to-tier output point associated with a primary path of a non-testable circuit that forms part of a logically complete multiple tier circuit; and creating a logically complete secondary path from the identified tier-to-tier point such that the non-testable circuit can be tested. In this configuration, the non-testable circuit and the secondary path are located on a single die.

In a further aspect, a testable die is provided. The die includes a non-testable circuit that forms part of a logically complete multiple tier circuit, and a tier-to-tier input point or a tier-to-tier output point associated with a primary path of the non-testable circuit. The primary path is for connecting to another part of the multiple tier circuit on another tier. The die also includes a logically complete secondary path from the tier-to-tier input or output point of the non-testable circuit, for testing the non-testable circuit, and means to switch from the primary path to the secondary path upon assertion of a test signal.

The foregoing has outlined rather broadly the features and technical advantages of the present disclosure in order that the detailed description that follows may be better understood. Additional features and advantages will be described hereinafter which form the subject of the claims. It should be appreciated by those skilled in the art that the conception and specific configurations disclosed may be readily utilized as a basis for modifying or designing other structures for carrying out the same purposes of the present disclosure. It should also be realized by those skilled in the art that such equivalent constructions do not depart from the spirit and scope of the invention as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present disclosure, reference is now made to the following descriptions taken in conjunction with the accompanying drawings.

DETAILED DESCRIPTION

Figure 1:
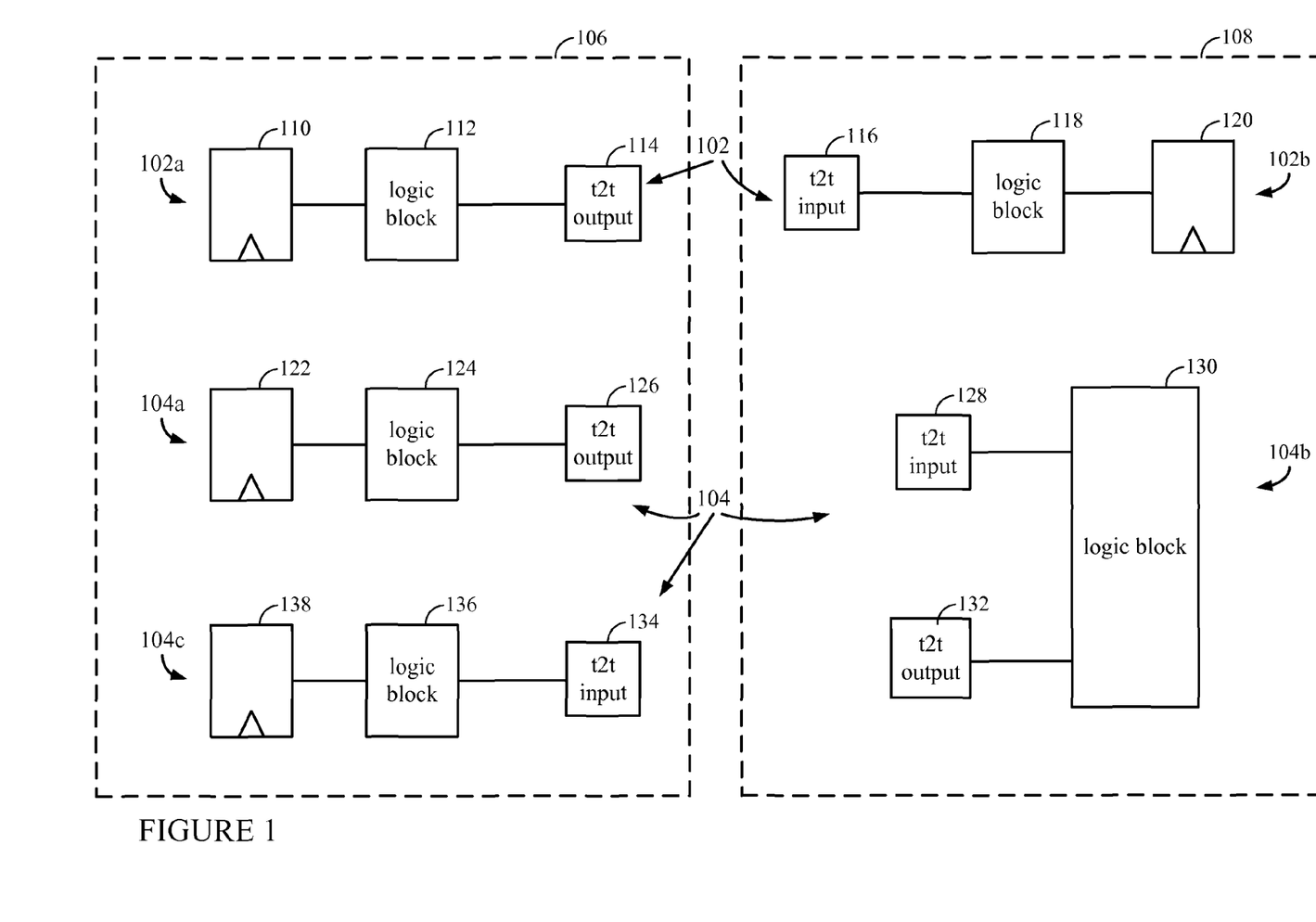
FIG. 1 is a schematic drawing of circuits that extend over two dies.

Logic diagrams of two exemplary circuits 102 and 104 are shown in FIG. 1. Each circuit is split over two dies, or "tiers," 106 and 108 of a multiple tier stack. In the first tier 106, a circuit 102a includes a latch circuit 110 connected to a logic block 112, which in turn connects to a tier-to-tier output pin 114. In the second tier 108, a circuit 102b includes a tier-to-tier input pin 116 connected to a logic block 118, which in turn connects to a latch circuit 120. In the multiple tier stack, the tier-to-tier output pin 114 is coupled to the tier-to-tier input pin 116, which brings the circuits 102a and 102b together to form the complete circuit 102.

The circuit 104 includes circuits 104a, 104b and 104c. In the first tier 106, the circuit 104a includes a latch circuit 122 connected to a logic block 124, which is connected to a tier-to-tier output pin 126. In the multiple tier stack, the output pin 126 is coupled to a tier-to-tier input pin 128 of the second tier 108. The input pin 128 is connected to a logic block 130, which connects to a tier-to-tier output pin 132, forming the circuit 104b of the second tier 108. In the multiple tier stack, the output pin 132 is coupled to a tier-to -tier input pin 134 of the first tier 106. The input pin 134 connects to a logic block 136, which is connected to a latch circuit 138, forming another part of the circuit 104c in the first tier 106.

Each tier contains only a portion of the logically complete circuits 102 and 104. When the tiers are separated, the circuits 102a, 104a and 104c are logically incomplete. Similarly, the circuits 102b and 104b of the second tier 108 are logically incomplete when the tiers are separated. Such logically incomplete circuits cannot be tested when the dies 106 and 108 are tested individually.

To make a die and its logically incomplete circuits testable, additional components are added to the die. Upon the assertion of a test signal indicating that the die is not part of a multiple tier stack, a tier-to-tier input or output point associated with a primary path of a logically incomplete circuit is reconfigured by means of the added components to create a logically complete secondary path from the tier-to-tier input or output point. Formation of the logically complete secondary path in the die allows the logically incomplete circuits to be tested.

As used herein, the term "primary path" refers to a path that includes a tier-to-tier input or a tier-to-tier output. In FIG. 1, for example, each of the circuits 102a, 102b, 104a, 104b and 104c provides a primary path. The term "tier-to-tier" refers to a signal that moves from one tier to another in a multiple tier stack. The term "secondary path" refers to a path over which a tier-to-tier input or output is rerouted to form a logically complete circuit on a single tier. The term "non-testable circuit" refers to a logically incomplete circuit of a die, where the logically incomplete circuit combines with one or more circuit elements of at least one other die to form a logically complete circuit.

In some configurations, a logically complete secondary path is created in a die by coupling a tier-to-tier input point of a non-testable circuit of the die to a tier-to-tier output point of the same or different non-testable circuit of the die. Pairs of tier-to-tier input and output points can be coupled to provide multiple logically complete secondary paths in the die. In certain configurations, as many pairs of tier-to-tier input and output points as possible are coupled together to create logically complete secondary paths for testing.

An unpaired tier-to-tier input may be available because the number of tier-to-tier inputs exceeds the number of tier-to-tier outputs. Alternatively, a tier-to-tier input may be left unpaired even though a tier-to-tier output is available. For example, it may be inconvenient to pair a tier-to-tier input with a tier-to-tier output, or for design reasons, a tier-to-tier output is not used. Any unpaired tier-to-tier input can be reconfigured in various ways. One way is to force the input to a known value, as discussed below. Although a tier-to-tier input that is forced to a known value can only be tested at that value, such partial testing is still valuable. Another way of reconfiguring an unpaired tier-to-tier input is to pair the input with a tier-to-tier output that is already paired to another tier-to-tier input. In this case, and in general, care should be taken to prevent the formation of a logical feedback loop when pairing a tier-to-tier input with a tier-to-tier output, since a logical feedback loop can force a secondary pathway to a single value or create an unstable loop that oscillates between two values.

If an unpaired tier-to-tier output is available, a latch circuit can be added, and the output can be connected to the added latch circuit to make a secondary pathway. Another option is to do nothing, keeping the unpaired output as is. Although the logic of an unpaired output will not be tested, an IDDQ (quiescent power supply current) test to detect manufacturing faults can still be performed in the presence of unpaired tier-to-tier outputs. In contrast, the inclusion of unpaired tier-to-tier inputs can limit die testing using an IDDQ test.

One factor to consider when deciding to add latches to unpaired tier-to-tier outputs is the increased circuit area taken up by the added die components. Another factor is the increased power requirements of the added components.

Figure 2:
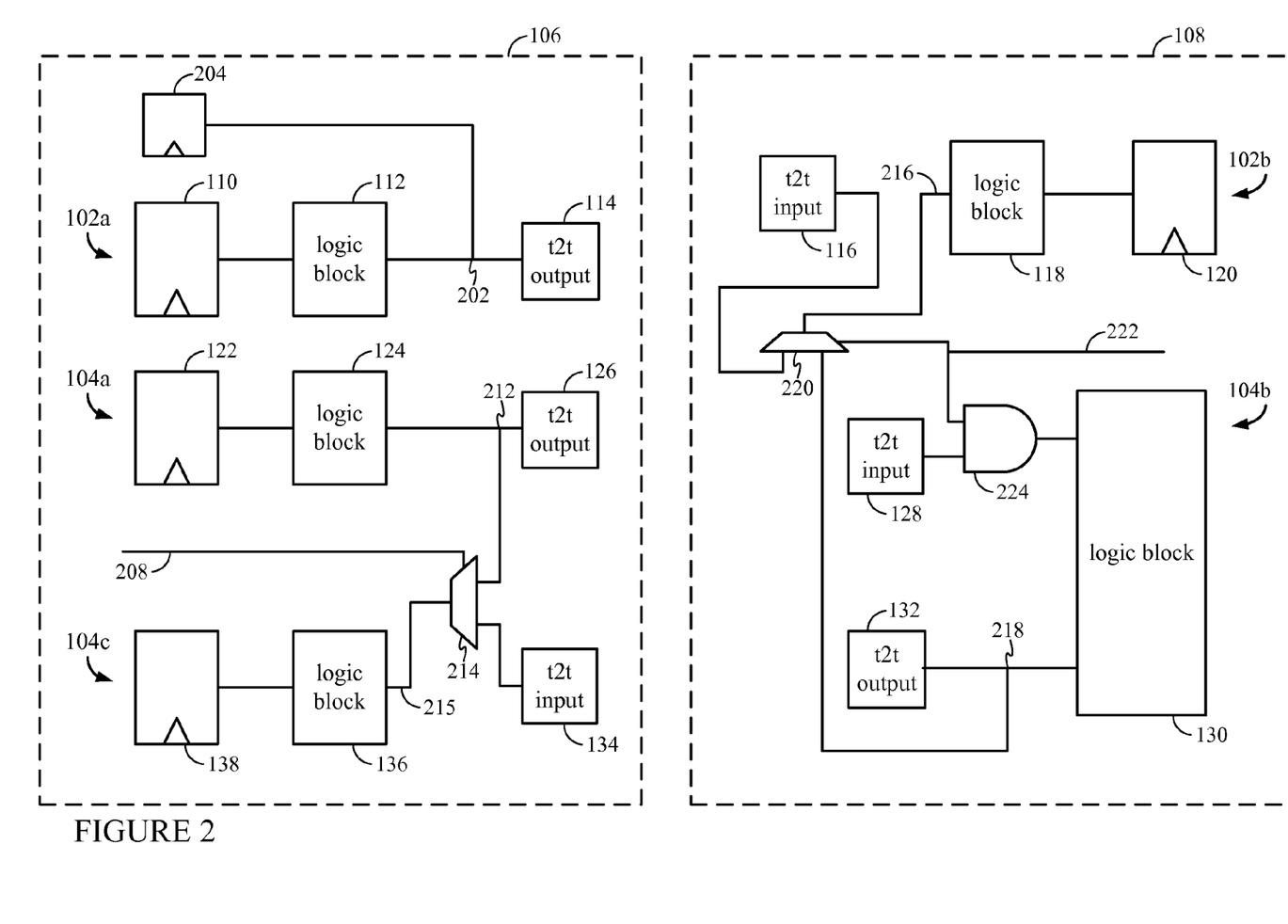
FIG. 2 is a schematic drawing of circuits with secondary paths for testing die functioning.
Figure 3:
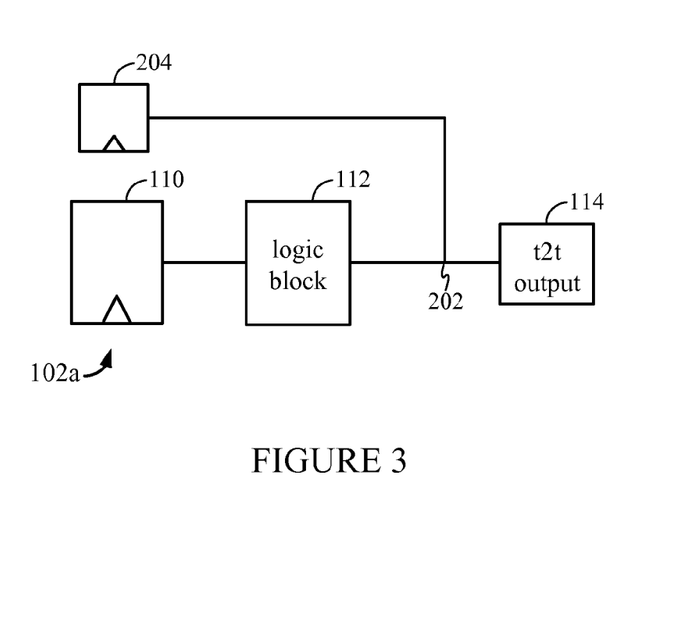
FIG. 3 is a schematic drawing of a circuit from FIG. 2.

FIG. 2 shows the circuits 102a,b and 104a,b,c with examples of added components that form logically complete secondary paths. As also seen in FIG. 3, in the first die 106, a secondary path is created by connecting a tier-to-tier output point 202 to a test point, which in this case includes a newly added test latch circuit 204. Under test conditions, a logically complete path is formed from the latch circuit 110 to the test latch circuit 204 enabling the testing of all logic elements in the circuit 102a. A clock element for the test latch circuit can be enabled by a test mode or by a test signal such as the global test signal described below. The latch circuit 204 can be part of a test scan chain circuit.

Figure 4:
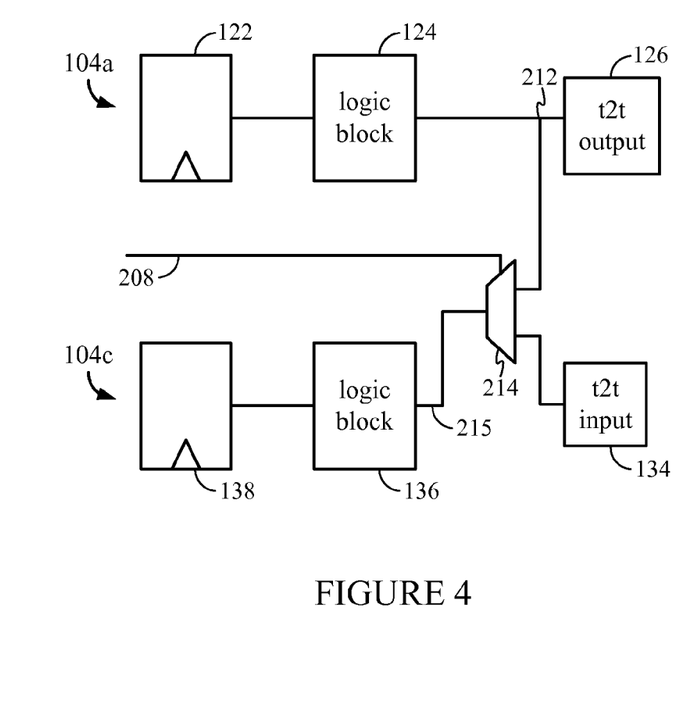
FIG. 4 is a schematic drawing of circuits from FIG. 2.

As shown in FIG. 2 and also seen in FIG. 4, for the circuits 104a,104c of the first die 106, a secondary path is created by connecting a tier-to-tier output point 212 to a multiplexer 214, which is connected to the logic block 136 and the tier-to-tier input 134. The primary inputs for the multiplexer 214 are from the tier-to-tier output point 212 and the tier-to-tier input 134, while the primary output is the logic block 136. The multiplexer 214 is controlled by a global test signal 208, which can be a global test signal that indicates whether the die 106 is to be configured for isolated tier mode operation or stacked mode operation. The global test signal 208 can also be used to configure the die 106 back to an isolated tier mode even when the die 106 is stacked. When the global test signal 208 is asserted on the multiplexer 214, a logically complete "secondary path" exists from the latch circuit 122 to the latch circuit 138 so that the logic elements in the various subcircuits 122, 124 and 136, 138 can be tested. When the global test signal 208 is not asserted, the latch circuit 122 is connected to the output pin 126 of the circuit 104a, and the latch 138 is connected to the input pin 134 of the circuit 104c. Thus, in the absence of the global test signal 208, the circuits 104a,104c operate normally to create the intended circuit resulting from coupling of the tiers 106 and 108. In this configuration, the tier-to-tier output point 212 is paired with a tier-to-tier input point 215 of the same non-testable circuit 104a, 104c.

If the die 106 contains another non-testable circuit in which a multiplexer is used to create a logically complete secondary path between a tier-to-tier output point and a tier-to-tier input point, the global test signal controlling this multiplexer can be the same as the global test signal 208. In other configurations, the global test signals controlling various multiplexers can be different.

Figure 5:
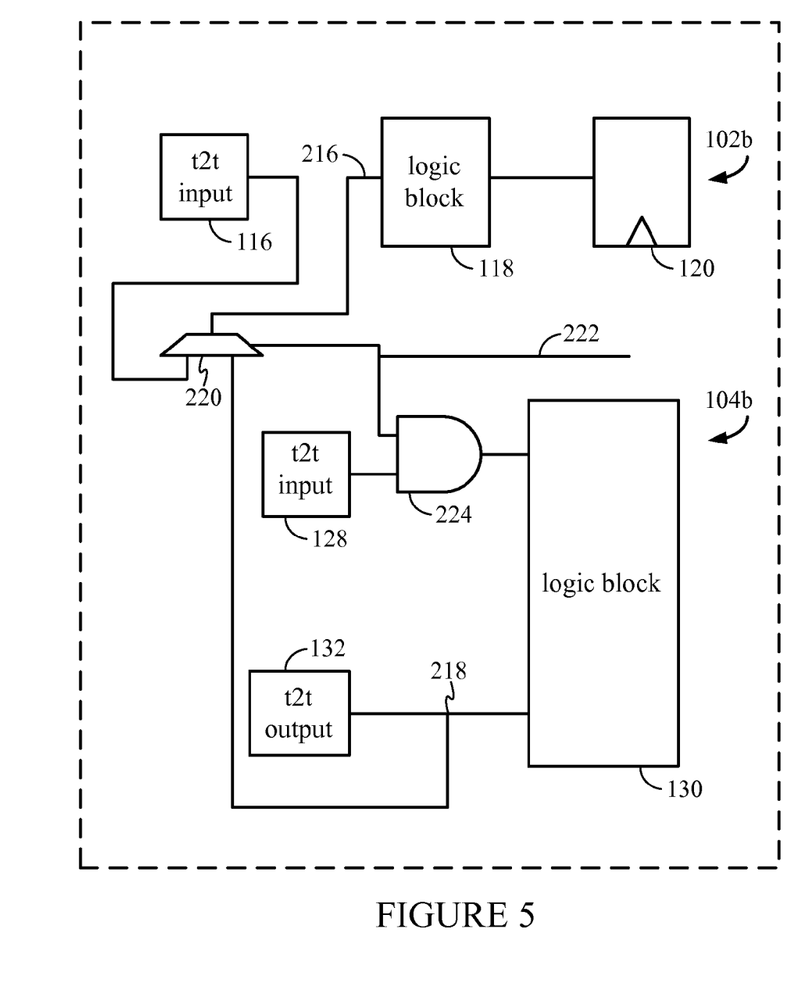
FIG. 5 is a schematic drawing of circuits from FIG. 2 with secondary paths.

As shown in FIG. 2 and also seen in FIG. 5, in the second die 108, the circuits 102b and 104b are reconfigured by coupling the tier-to-tier input point 116 of the circuit 102b to a tier-to-tier output point 218 of the circuit 104b through a multiplexer 220 to create a logically complete secondary path from the logic block 130 to the latch circuit 120. A global test signal 222 controls the multiplexer 220 to reconfigure the circuits 102b and 104b into the secondary path for testing purposes, and into the primary paths during normal operation. This is an example of a tier-to-tier input point coupled to a tier-to-tier output point of a different non-testable circuit.

In the circuit 104b, the input pin 128 is not directly connected to the tier-to-tier output point 218 since a direct connection between the input pin 128 and the tier-to-tier output point 218 is presumed to create a logical feedback loop in this case. A logical feedback loop could occur depending on the configuration of the logic block 130. In such a case, or when a feedback state exists, or a primary input cannot be matched to a primary output, or for any other reason, an input can be forced to a known value to permit at least partial testing of the complete circuit. In other words, for a known value, whether the logic block has the correct response can be determined. Moreover, an IDDQ test can be performed. In the present case, the input pin 128 is reconfigured to connect to an AND gate 224, which also receives the global test signal 222 as an input. Upon assertion of the global signal 222, a logic path with a known value is created from the input pin 128 to the logic block 130. Thus, if an input/output cannot be connected to another input/output to create a secondary path, the input can be forced to a known state to permit at least partial testing.

FIG. 2 provides various examples of the way components can be arranged in a logically incomplete circuit to form logically complete secondary paths. Any other way of arranging circuit components is contemplated as long as the circuit components are arranged to form logically complete secondary paths from tier-to-tier input or output points.

As described herein, non-testable circuits can be reconfigured to provide logically complete secondary paths for die testing. In one configuration, as many tier-to-tier input and output points are paired as possible. Any unpaired tier-to-tier input point can be forced to a known value, or coupled to a tier-to-tier output point that is also coupled to another tier-to-tier input point. If the first method is employed, care is taken not to create a logic feedback loop. Any unpaired tier-to-tier output point can be left unpaired, or can be coupled to a test latch.

The logically complete secondary paths of individual dies can be tested using a built-in self-test (BIST) mechanism or other testing methodology such as scan chain or functional patterns. Thus, the formation of logically complete secondary paths from tier-to-tier connections provides for greater test coverage when testing the functionality of circuits split amongst dies.

Dies prepared as described herein can be incorporated into multiple die stacks for use in integrated circuits. In addition, the dies can be incorporated in an electronic device, such as a computer or a cell phone.

Figure 6:
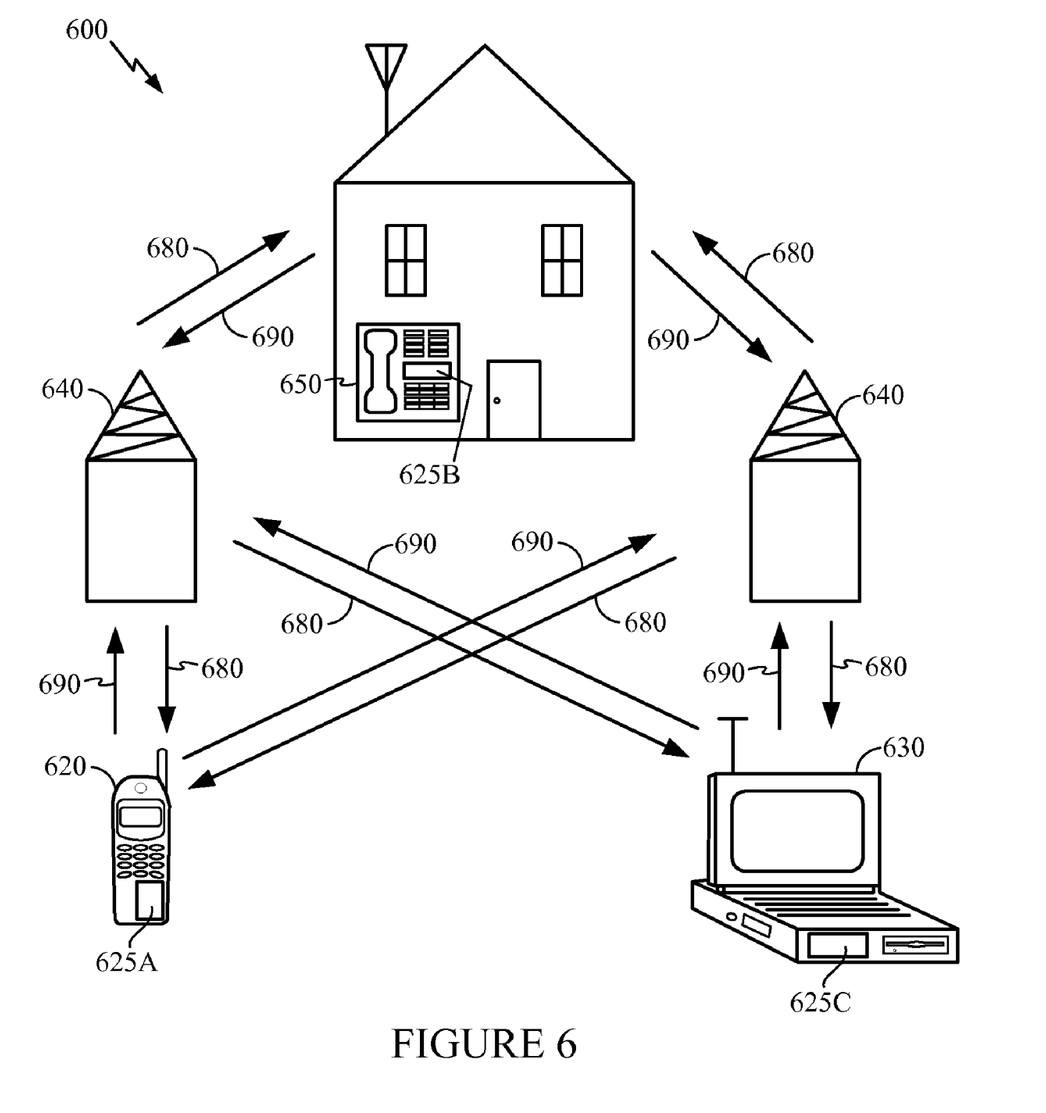
FIG. 6 is a drawing of an exemplary wireless communication system in which embodiments of the invention may be advantageously employed.

Moreover, the dies can be incorporated into a wireless communication system. FIG. 6 shows an exemplary wireless communication system 600 in which an embodiment of the invention may be advantageously employed. For purposes of illustration, FIG. 6 shows three remote units 620, 630, and 650 and two base stations 640. It will be recognized that typical wireless communication systems may have many more remote units and base stations. Remote units 620, 630, and 650 include testable dies 625A, 625B and 625C, which is an embodiment of the invention as discussed further herein. FIG. 6 shows forward link signals 680 from the base stations 640 and the remote units 620, 630, and 650 and reverse link signals 690 from the remote units 620, 630, and 650 to base stations 640.

In FIG. 6, remote unit 620 is shown as a mobile telephone, remote unit 630 is shown as a portable computer, and remote unit 650 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 6 illustrates remote units according to the teachings of the invention, the invention is not limited to these exemplary illustrated units. The invention may be suitably employed in any device which includes multiple dies stacked into tiers.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present invention. Accordingly, the appended claims are intended to include within their scope such processes, machines, manufacture, compositions of matter, means, methods, or steps.

What is claimed is:

1. A method of reconfiguring a die having a logically incomplete circuit, said logically incomplete circuit forming a part of a logically complete multiple tier circuit, the method comprising:

reconfiguring a tier-to-tier point comprising a tier-to-tier input point or output point associated with a primary path of the logically incomplete circuit by creating a logically complete secondary path for the tier-to-tier input or output point such that the logically incomplete circuit becomes a logically complete circuit that can be tested.

2. The method of claim 1, wherein the tier-to-tier point is an input point, and the logically complete secondary path is created by coupling the tier-to-tier input point to a tier-to-tier output point of the same non-testable circuit or a different logically incomplete circuit of the die.

3. The method of claim 1, wherein the tier-to-tier point is an input point and the logically complete secondary path is created by forcing the tier-to-tier input point to a known value.

4. The method of claim 1, wherein the tier-to-tier point is an output point, and the logically complete secondary path is created by coupling the tier-to-tier output point to a tier-to-tier input point of the same logically incomplete circuit or a different logically incomplete circuit of the die.

5. The method of claim 1, wherein the tier-to-tier point is an output point and the logically complete secondary path is created by coupling the tier-to-tier output point to a latch circuit.

6. The method of claim 1, wherein the tier-to-tier point is an input point and the logically complete secondary path is created by coupling the tier-to-tier input point to a tier-to-tier output point of the same logically incomplete circuit or a different logically incomplete circuit of the die, wherein the tier-to-tier output point is also coupled to a different tier-to-tier input point of the die, provided that the logically complete secondary path does not result in a feedback loop.

7. The method of claim 1, further comprising asserting a test signal to activate the logically complete secondary path.

8. A method of preparing a testable die, the method comprising:

identifying a tier-to-tier input point or a tier-to-tier output point associated with a primary path of a logically incomplete circuit that forms part of a logically complete multiple tier circuit; and creating a logically complete secondary path from the identified tier-to-tier input or output point such that the logically incomplete circuit can be tested;

wherein the logically incomplete circuit and the logically complete secondary path are located on a single die.

9. The method of claim 8, wherein the creating a logically complete secondary path comprises coupling the identified tier-to-tier point to a tier-to-tier output point of the same logically incomplete circuit or a different logically incomplete circuit of the die when the identified tier-to-tier point is an input point.

10. The method of claim 8, wherein the creating a logically complete secondary path comprises forcing the identified tier-to-tier point to a known value when the identified tier-to-tier point is an input point.

11. The method of claim 8, wherein the creating a logically complete secondary path comprises coupling the identified tier-to-tier point to a tier-to-tier input point of the same logically incomplete circuit or a different logically incomplete circuit of the die when the identified tier-to-tier point is an output point.

12. The method of claim 8, wherein the creating a logically complete secondary path comprises coupling the identified tier-to-tier point to a latch circuit when the identified tier-to-tier point is an output point.

13. The method of claim 8, wherein the creating a logically complete secondary path comprises coupling the identified tier-to-tier point to a tier-to-tier output point of the same logically incomplete circuit or a different logically incomplete circuit of the die when the identified tier-to-tier point is an input point, wherein the tier-to-tier output point is also coupled to a different tier-to-tier input point of the die, provided that the logically complete secondary path does not result in a feedback loop.

14. A testable die comprising:
   a logically incomplete circuit that forms part of a logically complete multiple tier circuit;
   a tier-to-tier point comprising a tier-to-tier input point or output point associated with a primary path of the logically incomplete circuit, the primary path for connecting to another part of the multiple tier circuit on another tier;
   a logically complete secondary path from the tier-to-tier input or output point of the logically incomplete circuit, for testing the logically incomplete circuit; and
   means to switch from the primary path to the logically complete secondary path upon assertion of a test signal.

15. The die of claim 14, wherein the tier-to-tier point is an input point and the logically complete secondary path is created by coupling the input point to a tier-to-tier output point of a second logically incomplete circuit of the die.

16. The die of claim 15, wherein the two logically incomplete circuits are part of the multiple tier circuit.

17. The die of claim 15, wherein the die further comprises another tier-to-tier input point that is also coupled to the tier-to-tier output point of the logically incomplete circuit, provided that the logically complete secondary path does not result in a feedback loop.

18. The die of claim 16, wherein the die further comprises another tier-to-tier input point that is also coupled to the tier-to-tier output point of the second logically incomplete circuit, provided that the logically complete secondary path does not result in a feedback loop.

19. The die of claim 14, wherein the tier-to-tier point is an input point and the logically complete secondary path is created by forcing the tier-to-tier input point to a known value.

20. The die of claim 14, wherein the tier-to-tier point is an output point and the logically complete secondary path is created by coupling the output point to a tier-to-tier input point of a second logically incomplete circuit of the die.

21. The die of claim 20, wherein the two logically incomplete circuits are part of the multiple tier circuit.

22. The die of claim 14, wherein the tier-to-tier point is an output point and the logically complete secondary path is created by coupling the tier-to-tier output point to a test point.

23. The die of claim 22, wherein the test point includes a latch circuit.

24. The die of claim 14 is integrated into at least one of a mobile phone, a set top box, a music player, a video player, an entertainment unit, a navigation device, a computer, a handheld personal communication systems (PCS) unit, a portable data unit, and a fixed location data unit.

* * * * *

UNITED STATES PATENT AND TRADEMARK OFFICE
CERTIFICATE OF CORRECTION

| | | |
|---|---|---|
| PATENT NO. | : 7,904,770 B2 | Page 1 of 1 |
| APPLICATION NO. | : 12/206977 | |
| DATED | : March 8, 2011 | |
| INVENTOR(S) | : Toms | |

It is certified that error appears in the above-identified patent and that said Letters Patent is hereby corrected as shown below:

Column 08, line 05, claim 15: "tier - to-tier" to read as --tier-to-tier--

Signed and Sealed this

Twentieth Day of September, 2011

David J. Kappos
*Director of the United States Patent and Trademark Office*